United States Patent
Ke et al.

(10) Patent No.: US 7,777,884 B2
(45) Date of Patent: Aug. 17, 2010

(54) METHOD AND SYSTEM FOR OPTIMIZING SUB-NANOMETER CRITICAL DIMENSION USING PITCH OFFSET

(75) Inventors: Chih-Ming Ke, Hsinchu (TW); Shinn-Sheng Yu, Hsinchu (TW); Yu-Hsi Wang, Taichung County (TW); Jacky Huang, Chu-Bei (TW); Tsai-Sheng Gau, Hsinchu (TW); Kuo-Chen Huang, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 453 days.

(21) Appl. No.: 11/625,997

(22) Filed: Jan. 23, 2007

(65) Prior Publication Data

US 2008/0174778 A1    Jul. 24, 2008

(51) Int. Cl.
    *G01B 11/00* (2006.01)
(52) U.S. Cl. .................................... 356/400
(58) Field of Classification Search ............... 356/399, 356/400
    See application file for complete search history.

(56) References Cited

U.S. PATENT DOCUMENTS

| | | | | | |
|---|---|---|---|---|---|
| 5,452,077 | A * | 9/1995 | Green | ................... | 356/139.01 |
| 5,805,290 | A * | 9/1998 | Ausschnitt et al. | .......... | 356/401 |
| 6,181,504 | B1 * | 1/2001 | Ahn | ....................... | 360/77.04 |
| 6,301,008 | B1 * | 10/2001 | Ziger et al. | ................. | 356/401 |
| 6,459,480 | B1 * | 10/2002 | Kye | ............................. | 356/124 |
| 6,570,157 | B1 * | 5/2003 | Singh et al. | ................. | 250/311 |
| 6,753,963 | B1 * | 6/2004 | Sicignano et al. | ........... | 356/399 |
| 6,958,819 | B1 * | 10/2005 | Heaton et al. | ............... | 356/616 |
| 6,982,793 | B1 * | 1/2006 | Yang et al. | ................... | 356/401 |
| 2002/0155356 | A1 * | 10/2002 | Fujimoto | ....................... | 430/5 |
| 2005/0184234 | A1 * | 8/2005 | Nakayama | .................. | 250/311 |
| 2007/0114449 | A1 * | 5/2007 | Nakayama | ............... | 250/491.1 |

OTHER PUBLICATIONS

China Patent and Trademark Office, Chinese Office Action dated May 8, 2009, Application Serial No. 200810004166.5, 7 pages.
Toshiyuki Yoshimura, "Nanometer-Level Metrology With A Low-Voltage CD-SEM", SPIE vol. 3332 pp. 61-70, SPIE vol. 3332—Jun. 1998.
Yoshinori Nakayama et al., "Proposal for a New Submicron Dimension Reference For An Electron Beam Metrology System", J. Vac. Sci. Technol. B 6 (6), Nov./Dec. 1988, 1988 American Vacuum Society, 4 pages.

* cited by examiner

*Primary Examiner*—Tarifur R. Chowdhury
*Assistant Examiner*—Isiaka O Akanbi
(74) *Attorney, Agent, or Firm*—Haynes and Boone, LLP

(57) ABSTRACT

A method and a system are provided for calibrating metrological tools used to measure features of a semiconductor device. A critical dimension (CD) ruler defines a known pitch plus a pitch offset. A photoresist layer is measured to determine a measured pitch whereupon the measured pitch is compared to the known pitch. From the comparison, appropriate calibration steps can be taken to reduce the difference between the known pitch and the measured pitch.

15 Claims, 16 Drawing Sheets

METHOD AND SYSTEM FOR OPTIMIZING SUB-NANOMETER CRITICAL DIMENSION USING PITCH OFFSET

BACKGROUND

The present disclosure relates in general to integrated circuit manufacturing, and more particularly, to a system and method for sub-nanometer calibration of metrological tools. The present disclosure is also applicable with photomask fabrication.

In integrated circuit (IC) manufacturing technology, a photoresist layer is typically applied to a semiconductor wafer surface, followed by an exposure of the photoresist through a mask. A post-exposure baking process is then performed to alter physical properties of the photoresist for subsequent processing. An after development inspection (ADI) is then performed to inspect the critical dimension (CD) of the photoresist using a metrological system to determine whether it conforms to a specification. If the photoresist is within specification, a pattern is etched or transferred and the photoresist is stripped. An after etching inspection (AEI) is then performed on the wafer.

Increasingly, there is a desire to decrease the minimum feature sizes of very-large-scale integration (VLSI). Accordingly, lithography processes must provide precise CD control of photoresist patterns to avoid fluctuations in threshold voltages and line resistances associated with variations in pattern sizes that ultimately degrade circuit performance. To measure the variations in pattern sizes, scanning electron microscope (SEM), optical critical dimension (OCD), and other measurement processes are often used to assess the critical dimensions of a fabricated workpiece.

In conventional metrological techniques, a test workpiece, such as a semiconductor wafer, with a test pitch is used for calibrating metrological tools. This is achieved by having the metrological tool measure the pitch of the test wafer, which is a known value. If the measured pitch differs from the known pitch, the metrological tool is in need of calibration. The pitch of the test wafer is generally on the order of a couple hundred nanometers, e.g., 180 nm. In this regard, if the measured pitch differs from the known pitch by more than a given tolerance, the metrological tool must be recalibrated or any measurements taken by the metrological tool will be askew.

Known test wafers are constructed, as referenced above, to have photoresist lines with a pitch in excess of 100 nanometers. As such, these conventional test wafers are ineffective for calibrations less than one nanometer. Additionally, the metrological process can be damaging to the test wafer thereby requiring that several test wafers be fabricated and maintained. While it is possible to fabricate test wafers with sub-nanometer pitches, the process can be quite costly.

Therefore, it would be desirable to have a cost-effective process and apparatus for calibrating metrology tools at sub-nanometer levels.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the appended drawings illustrate only typical embodiments of this invention and are therefore not to be considered limiting in scope, for the invention may apply equally well to other embodiments.

DETAILED DESCRIPTION

Figure 1:
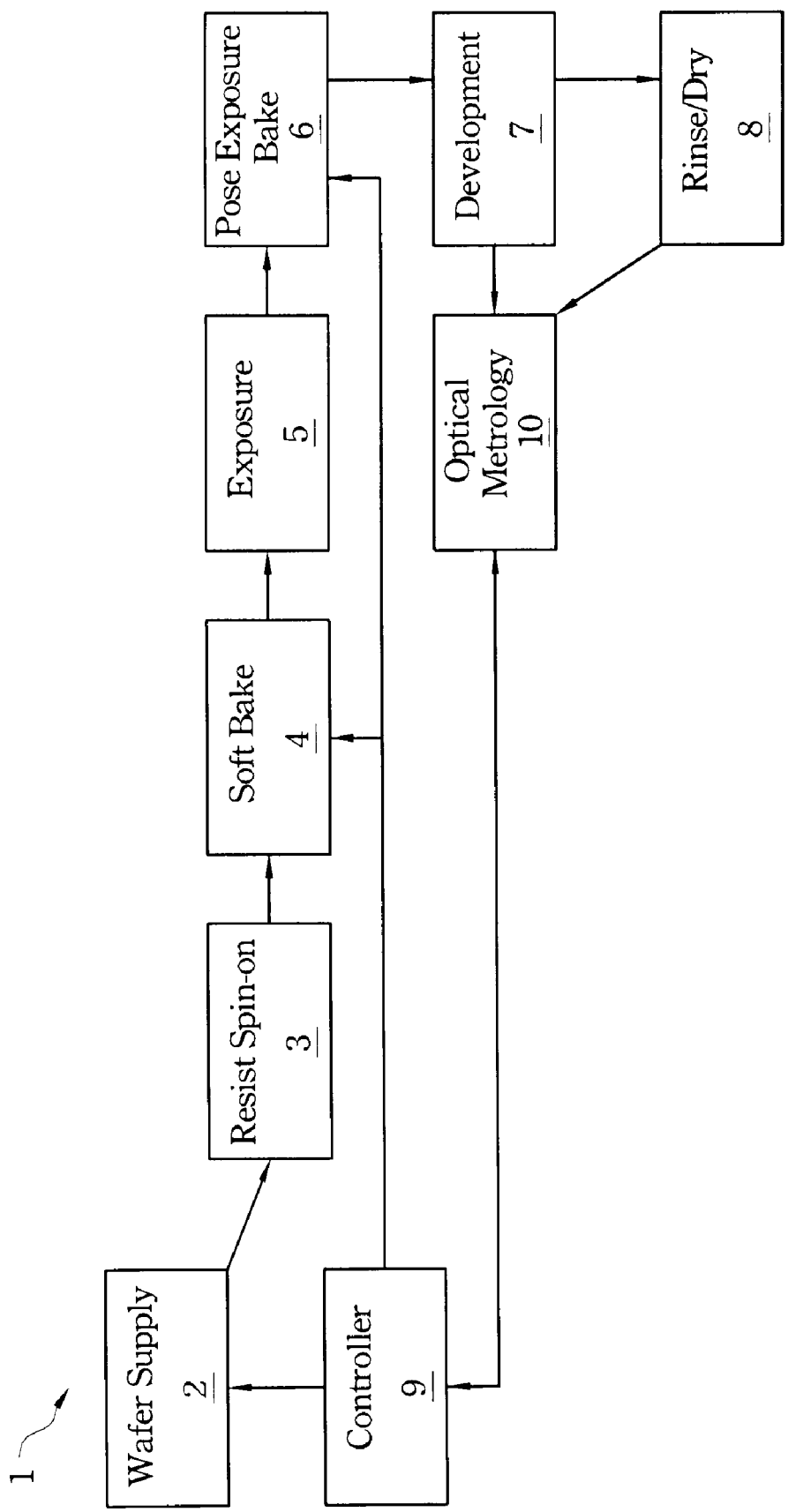
FIG. 1 is a diagram illustrating an exemplary lithography process track in which aspects of present disclosure may be implemented.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and apparatus for calibration of a metrological tool or system. In an illustrative embodiment, a photoresist layer is fabricated such that a photoresist grating pattern is formed with a designated pitch plus a pitch offset. In this illustrative embodiment, the pitch offset is less than one nanometer. By fabricating a semiconductor layer (or a portion thereof) to have a pitch plus a sub-nanometer pitch offset, the invention is helpful in calibrating measurement tools at the sub-nanometer level.

In one exemplary embodiment of the present disclosure, one or more test or calibration wafers are fabricated and used to calibrate metrology tools, such as those used for optical critical dimension (OCD) and scanning electron microscope (SEM) measurements. An exemplary lithography process track for fabrication of such a test wafer is illustrated in FIG. 1. The lithography process track 1 includes wafer supply racks 2, a photoresist spin-on station 3, a soft bake station 4, an exposure station 5, a post exposure bake station 6, a development station 7 and a rinse/dry station 8. A controller 9 automates the lithography process track 1 by communication with wafer supply racks 2, soft bake station 4, post exposure bake station 6 and optical metrology station 10.

Process wafers are first supplied by wafer supply racks 2 to the photoresist spin-on station 3 to coat the photoresist on a wafer surface. The wafer is then soft-baked at the soft-bake station 4 and transferred to the exposure station 5 to expose the wafer. Afterwards, a post-exposure bake is performed on the wafer at the post-exposure baking station 6 and the wafer is transferred to the development station 7. After development, the wafer may either be immediately transferred to an optical metrology station 10 or subjected to a rinse/dry at station 8 prior to being transferred to the optical metrology station 10. The optical metrology station 10 includes a spectrometer for collecting spectra of scattered light from the photoresist in a digital format. The controller 9 processes the collected spectra of scattered light and performs a diffraction analysis. Aspects of the present disclosure may be implemented within the controller 9 or optical metrology station 10 or other parts of the lithography process track 1 without departing from the spirit and scope of the present disclosure.

As described above, following post-exposure baking, the optical metrology station 10 is used to measure various features of a fabricated wafer(s) or workpiece(s). For those measurements to be accurate, the measurement tools must be well-calibrated. Exemplary structures for calibrating the measurement tools will now be described.

Figure 2A:
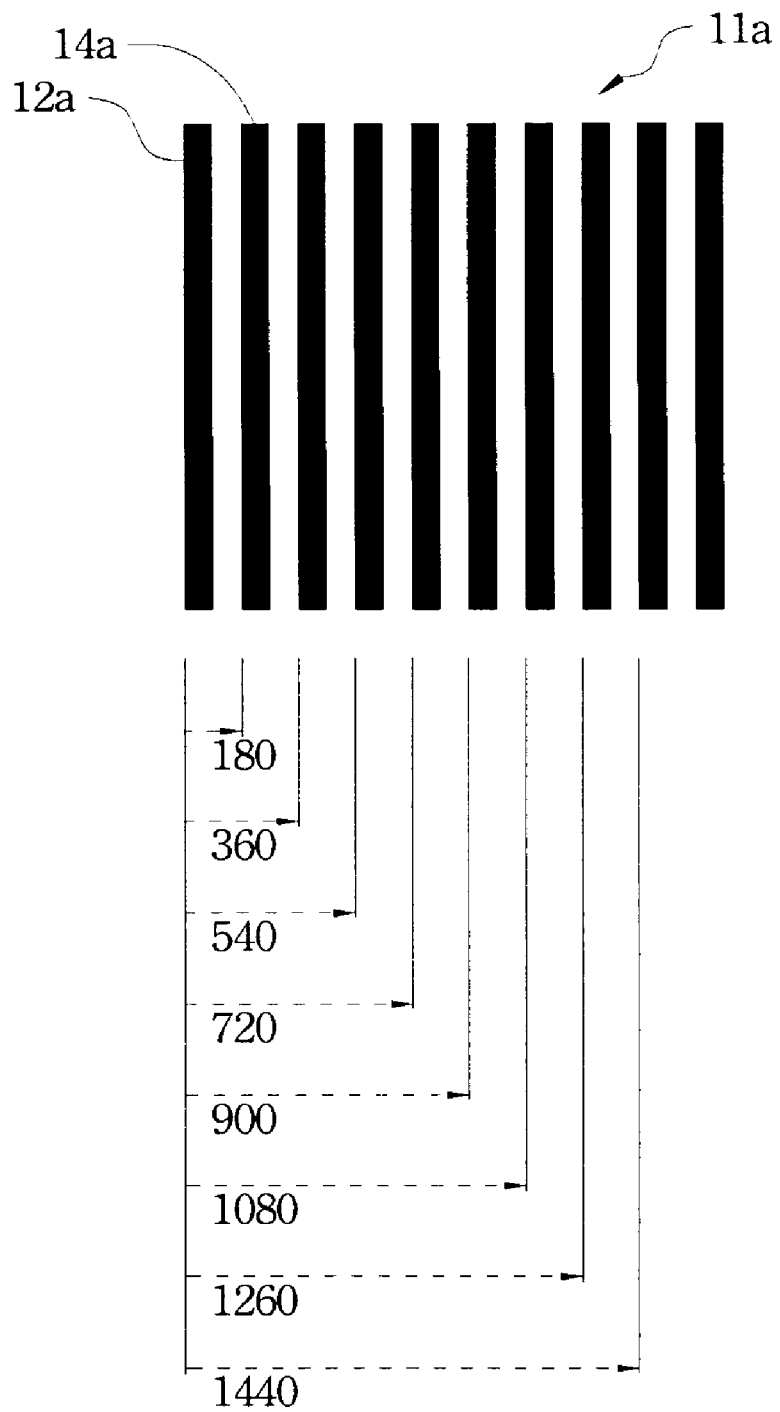
FIGS. 2A-2E are diagrams of exemplary delta CD rulers for sub-nanometer assessment according to one aspect of the present disclosure.
Figure 2B:
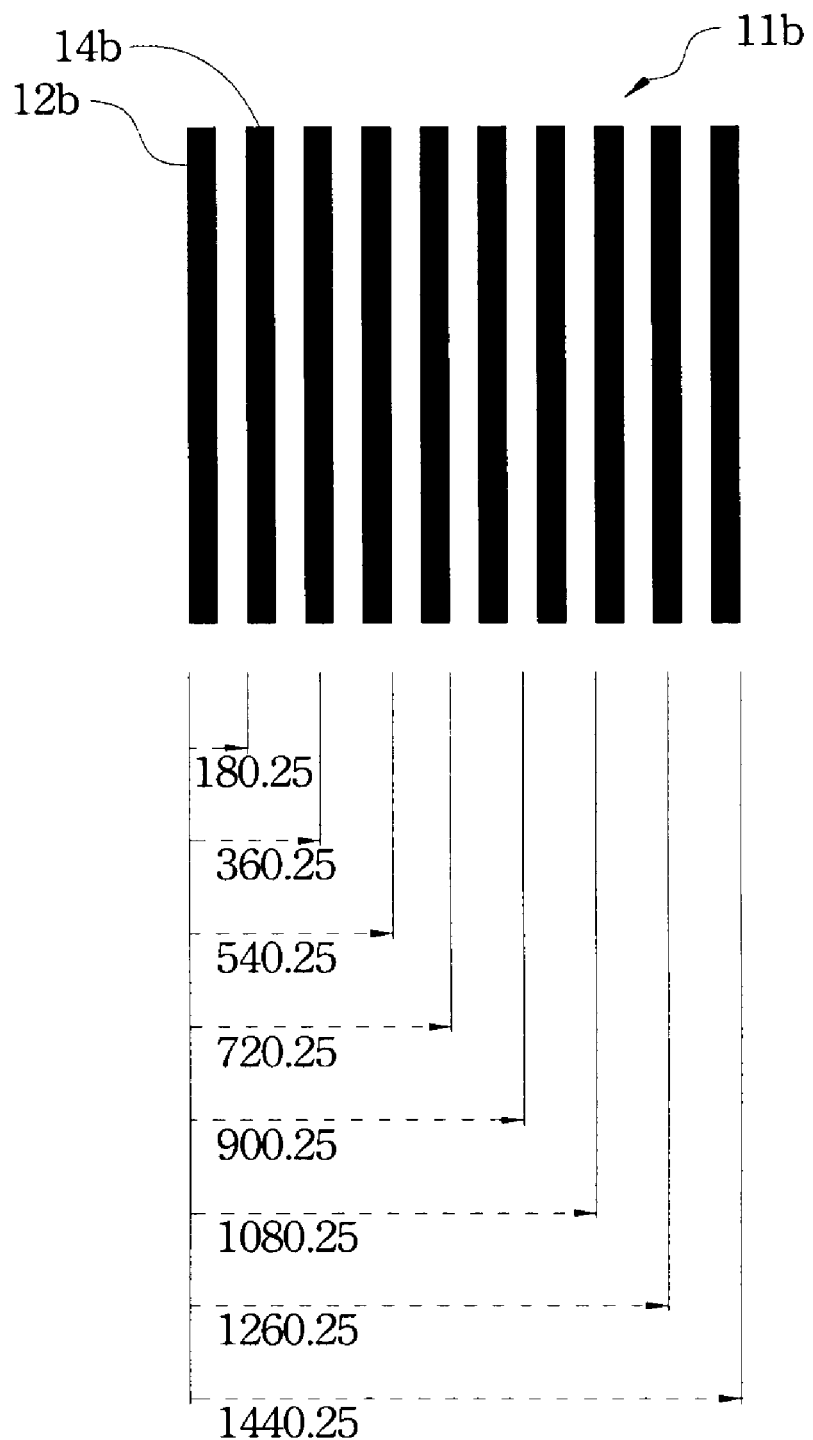
Figure 2C:
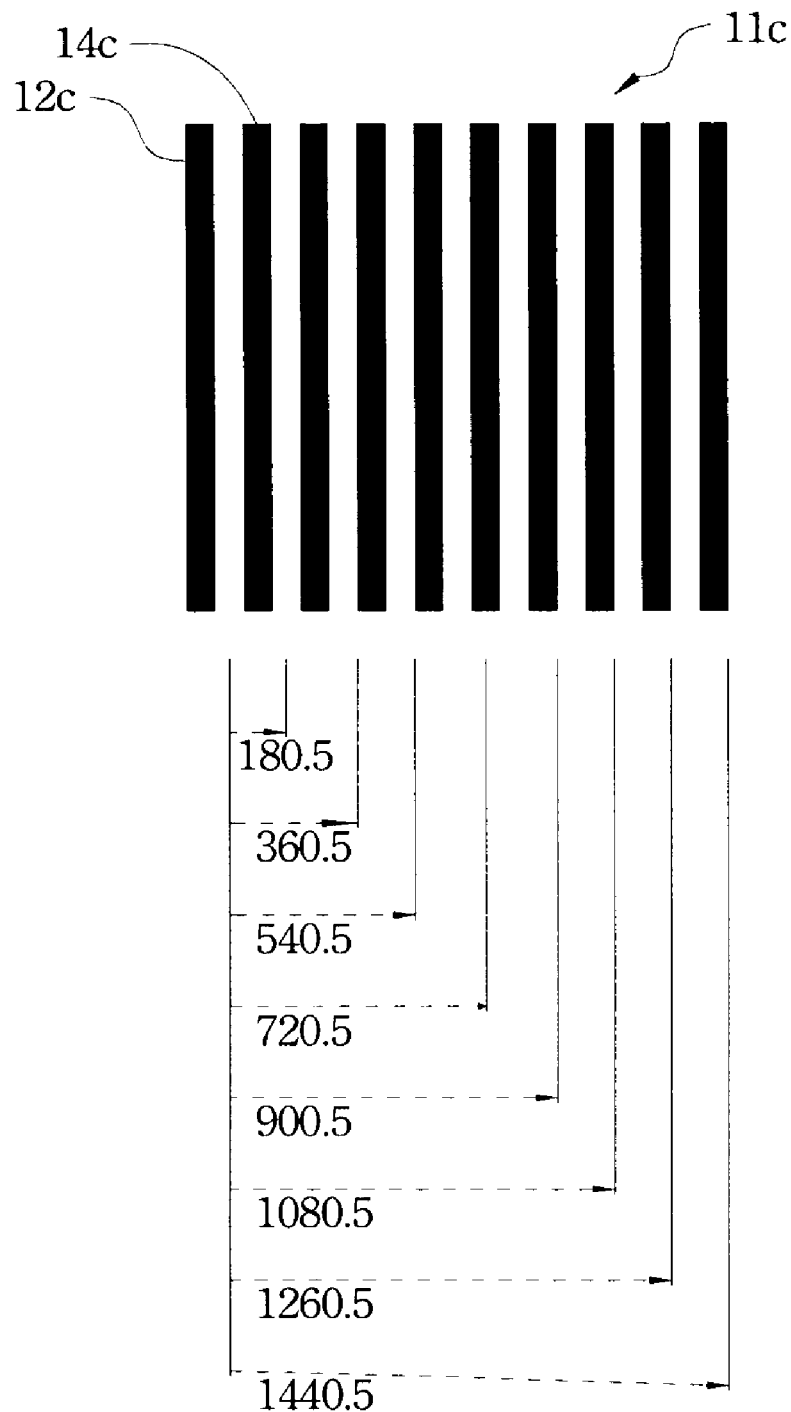
Figure 2D:
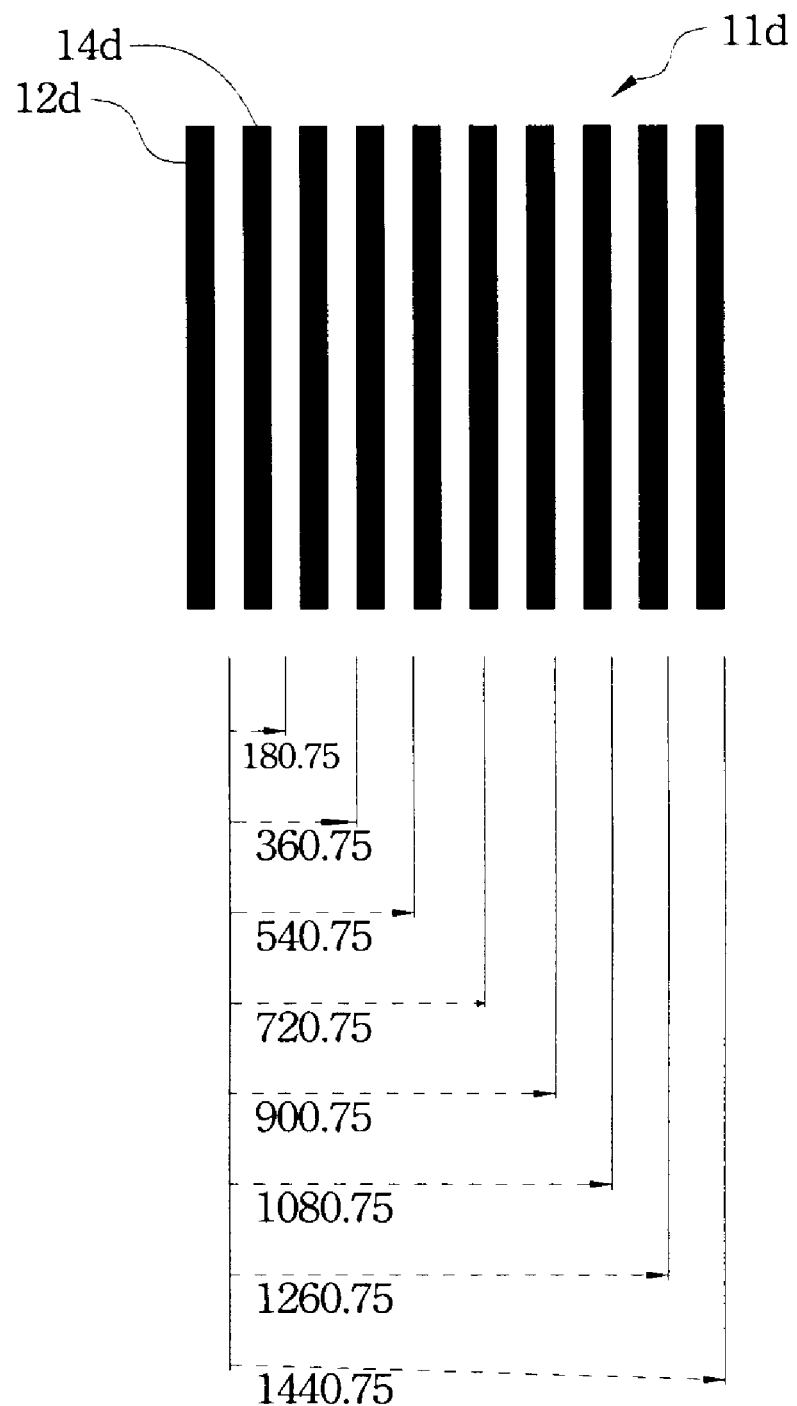
Figure 2E:
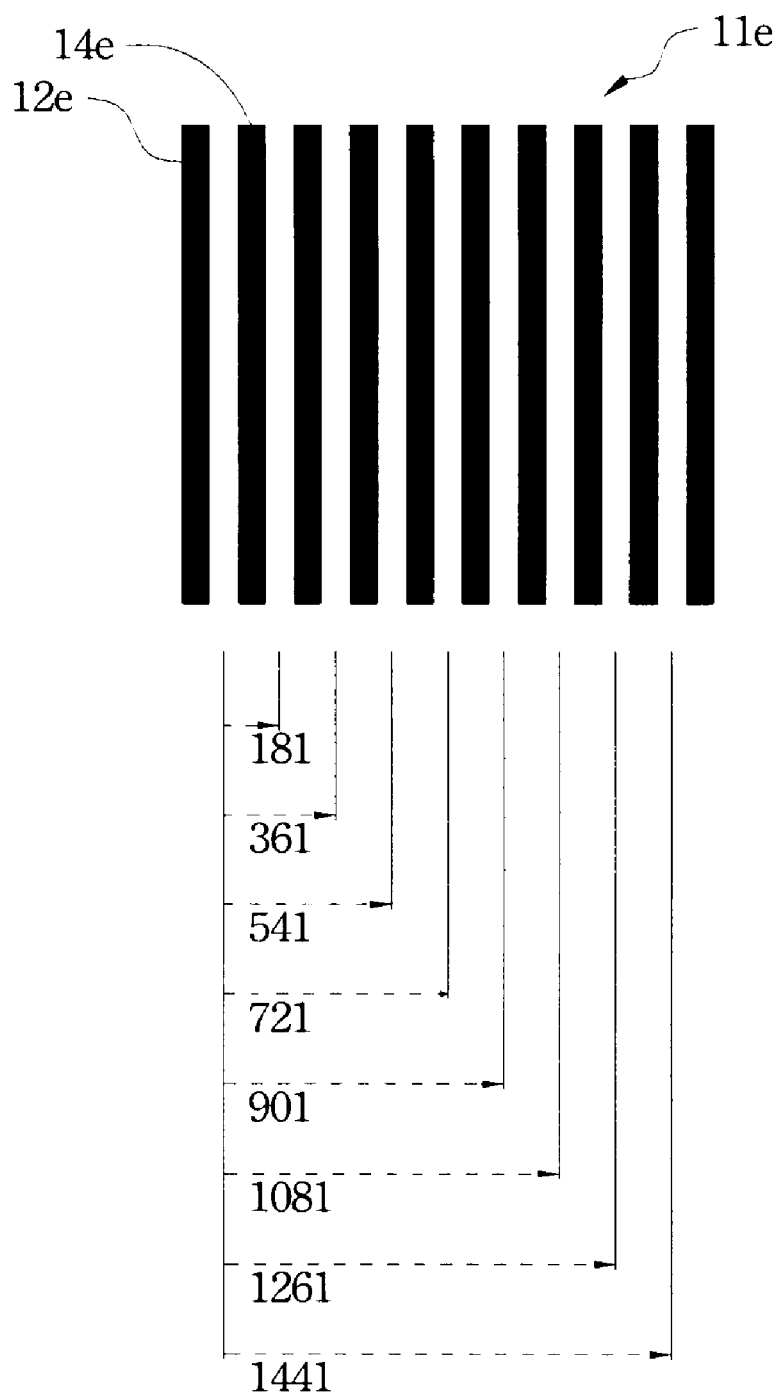

Referring now to FIGS. 2A-2E, a series of critical dimension (CD) rulers in the form of photoresists with different pitches are shown which, as described below, can be fabricated using the lithography process track illustrated in FIG. 1, or equivalents thereto, and used for sub-nanometer calibration of OCD, SEM, or other metrological systems. It is contemplated that the CD rulers may be used to calibrate the optical metrology system that is in the same line that is used to fabricate the rulers, or to calibrate metrological systems of other fabrication lines. In FIG. 2A, the photoresist grating 11a has a baseline pitch with zero pitch or CD offset. For example, the pitch between photoresist lines 12a and 14a is 180.00 nm. In FIG. 2B, the photoresist grating 11b has a pitch with a positive 0.25 nm offset. As such, assuming a baseline pitch of 180.00, the pitch between photoresist lines 12b and 14b is 180.25 nm. In FIG. 2C, the pitch offset is twice the offset of that of FIG. 2B and in FIG. 2D, the pitch offset is three times that of FIG. 2B. Thus, assuming a baseline pitch of 180.00 nm, the pitch offset between photoresist lines 12c and 14c is 0.50 nm and the pitch offset between photoresist lines 12d and 14d is 0.75 nm. In FIG. 2E, the pitch offset is equal to four times the pitch offset of FIG. 2B. Thus, assuming a baseline pitch of 180.00 nm, the pitch between photoresist lines 12e and 14e is 181.00. The series of photoresist gratings 11a-11e provide a continuum of pitches or delta CD rulers that can be used for calibration and data quality evaluation at the sub-nanometer level.

As noted above, the CD rulers or series of calibration photoresist lines may be formed on a single wafer or multiple wafers. In this regard, photoresist gratings 11c and 11d, for example, can be found on the same test wafer and their pitches compared. As described in the above example, photoresist grating 11c has a pitch of 180.50 nm and photoresist grating 11d has a pitch of 180.75 nm providing a differential test value of 0.25 nm. The pitch between the lines in grating 11c would be measured, the pitch between the lines of the grating 11d would be measured, and then the measured pitches for these two gratings would be subtracted or compared to obtain the pitch difference, which should theoretically be 0.25 nm. If the results from measuring respective pitches confirm such a differential, then the metrological system is believed to be well-calibrated. Thus, it is not the absolute pitch values that provide an indication of calibration, but rather, it is the measured sub-nanometer differential that provides the sub-nanometer performance metric.

Additionally, as to any given grating, it is contemplated that the pitch between two lines may be measured and used for calibration or the pitches between multiple lines can be measured and averaged to provide the measured pitch value for that particular CD ruler. It is understood that an average represents one of a number of exemplary statistical metrics that can be derived and used. For example, the median pitch value may be used. For a single photoresist pattern having multiple CD rulers that each have the same pitch, it is also contemplated that a single pattern pitch value may be determined by taking the average, median, or other statistical metric from all the photoresists lines or, alternatively, from a selected set of the photoresists lines from one or more CD rulers.

Figure 3:
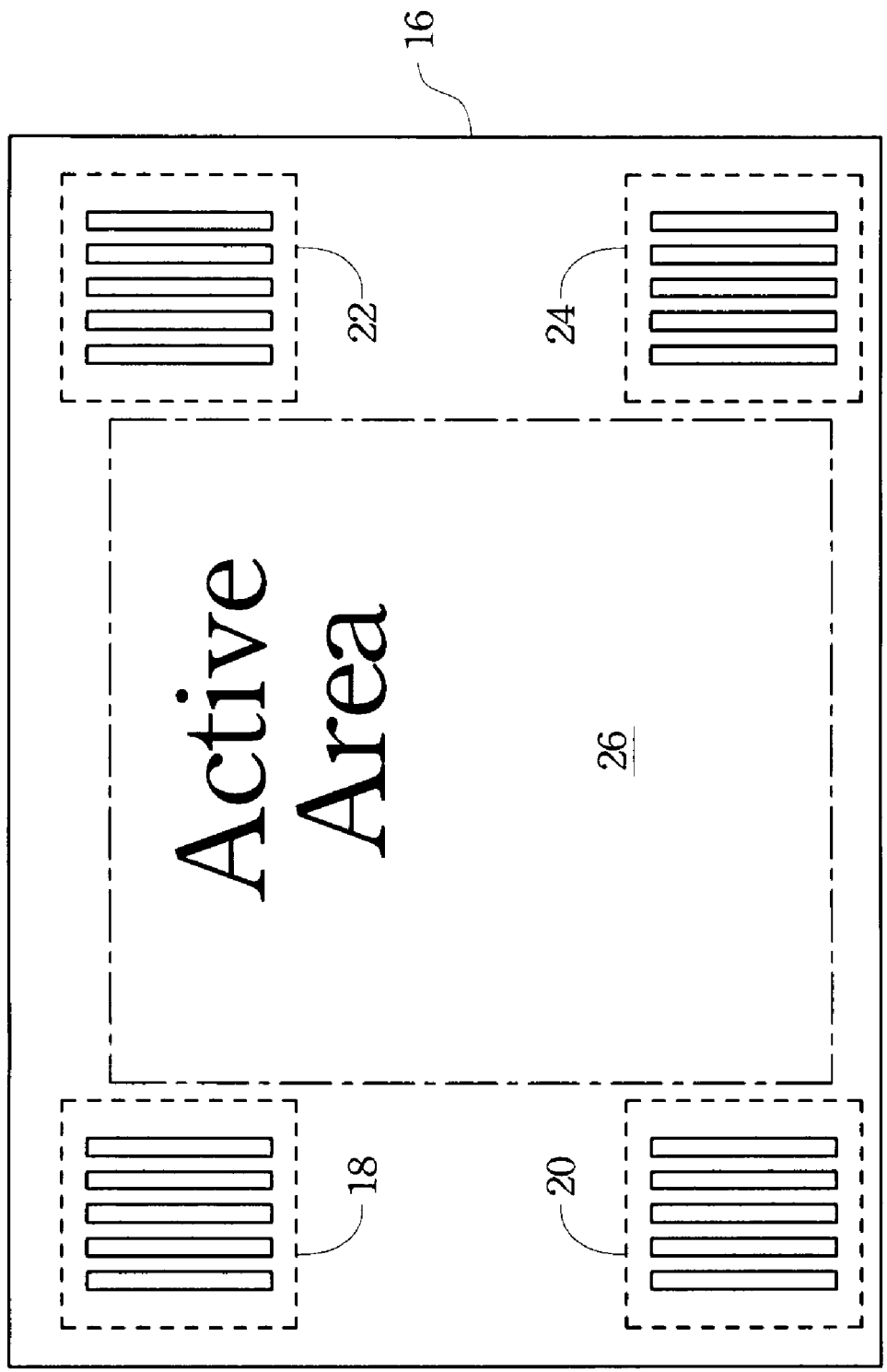
FIG. 3 is a schematic view of a calibration wafer having a series of CD rulers formed thereon.

As noted above, it is contemplated that a single wafer may have multiple sets of photoresist lines with a pitch offset between the sets to calibrate a metrological system or, alternatively, the sets of photoresist lines (CD rulers) may be formed on a series of test wafers. A single test wafer 16 with multiple CD rulers is schematically illustrated in FIG. 3. As shown, test wafer 16 has four sets of photoresist lines or CD rulers 18-24. In this illustrative example, CD ruler 18 has a baseline pitch and CD rulers 20-24 each have a pitch that is offset from the baseline pitch by a given pitch offset value, e.g., a multiple of 0.25 nm. As it is contemplated that the CD rulers can optionally be formed on a production wafer rather than a test wafer, the CD rulers 18-24 are preferably formed on a periphery of the wafer so as to avoid any active areas 26 of the wafer that contain the circuitry being fabricated. Since the wafer includes multiple CD rulers 18-24 with various pitch offsets, the wafer alone can be used to assess metrological performance. However, it is recognized that multiple calibration iterations may be desired with the testing of multiple test or calibration wafers.

It is contemplated that a single test wafer may have multiple CD rulers, all with the same pitch. In this regard, a single wafer provides multiple sampling zones that can be used to obtain a pitch value. This pitch value can then be compared to a pitch value averaged or otherwise statistically determined from multiple sampling zones of another test wafer. For this example, each of the CD rulers on test wafer 16 would have the same pitch whereas another test wafer (not shown) with another set of CD rulers would have a pitch plus a pitch offset. The difference in pitches between the two sets of CD rulers can then be used to assess metrology performance.

A number of metrology techniques may be used to measure pitch between sampling or calibration zones. Two exemplary techniques are SEM and OCD. While an exemplary OCD process will be described below, it is recognized that SEM and other known or future metrological tools can be calibrated in accordance with the present disclosure.

Figure 4:
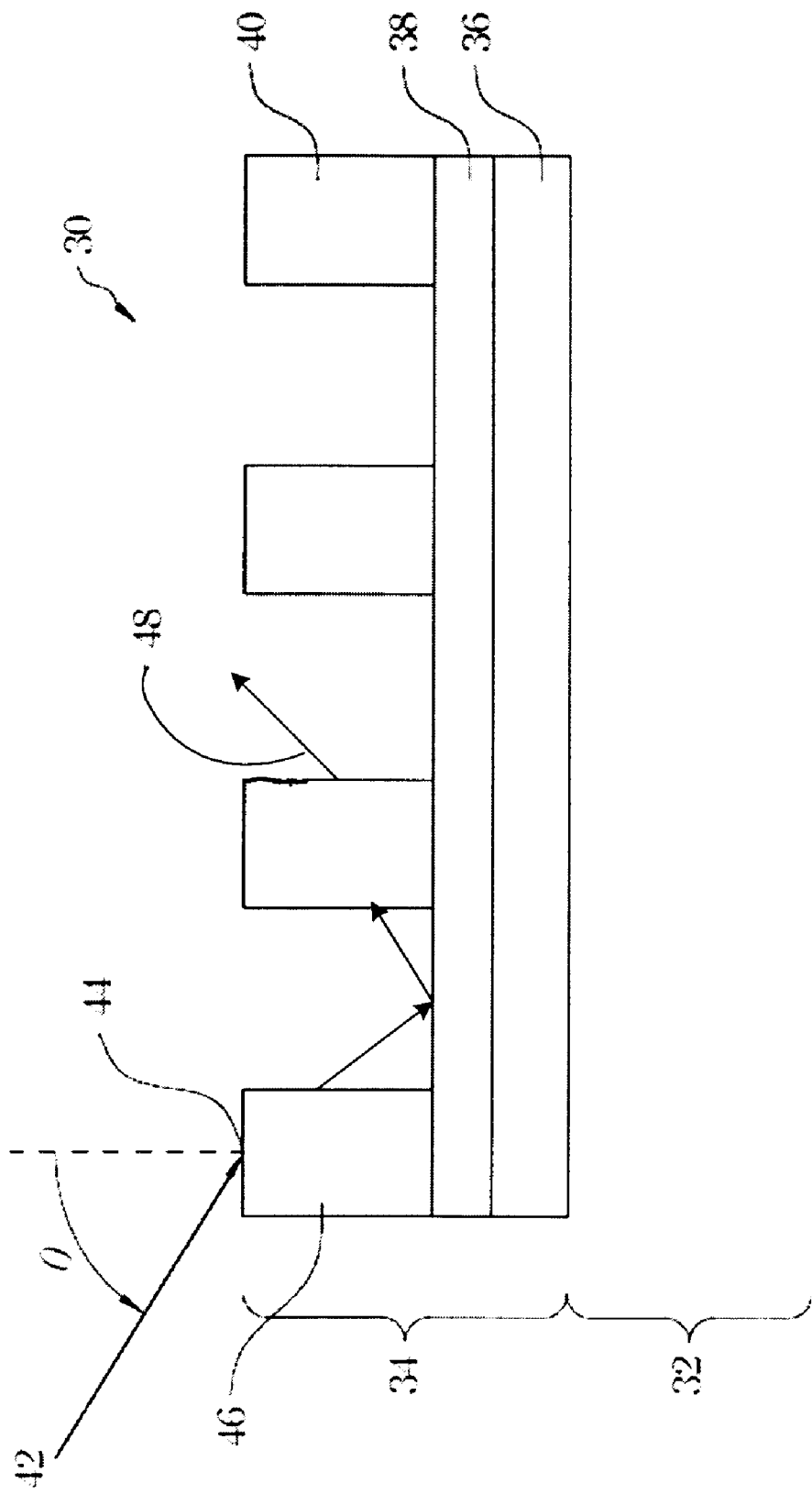
FIG. 4 is a diagram illustrating an exemplary process wafer subject to OCD based scatterometry.

For purposes of illustration and not limitation, an exemplary process wafer subjected to OCD based scatterometry is depicted in FIG. 4. OCD is used to collect one or more scattered spectra from a photoresist grating and perform diffraction analysis such that uniformity measurements and additional information may be gathered. Wafer 30 comprises a first layer 32 and a second layer 34. The first layer 32 is a substrate made of silicon or polysilicon. The first layer is also referred to as an optical dimension (OD) layer. Alternately, layer 32 may be a shallow trench isolation (STI) layer or active area (AA). In one example, the second layer 34 includes a poly layer 36, an antireflective layer 38, and a patterned photoresist layer 40. However, it is contemplated that the present disclosure is applicable with wafers of different constructs then that described above.

Incident light 42 from a probing light source of a spectrometer is directed to a probe area of the photoresist layer 40 forming an incident angle θ of between 0 to 90 degrees with respect to the photoresist surface. A portion 44 of the incident light 42 is scattered from the surface of photoresist layer 40 after passing through photoresist portion 46 to produce detectable scattered light 48. The scattered light 48 is collected by a conventional detector, such as a diode array detector, at different wavelengths. A diffraction analysis is then performed on scattered light 48 to obtain three dimensional information and other additional information of the photoresist layer 40 to, in part, calibrate the metrological system, as described herein.

Figure 5:
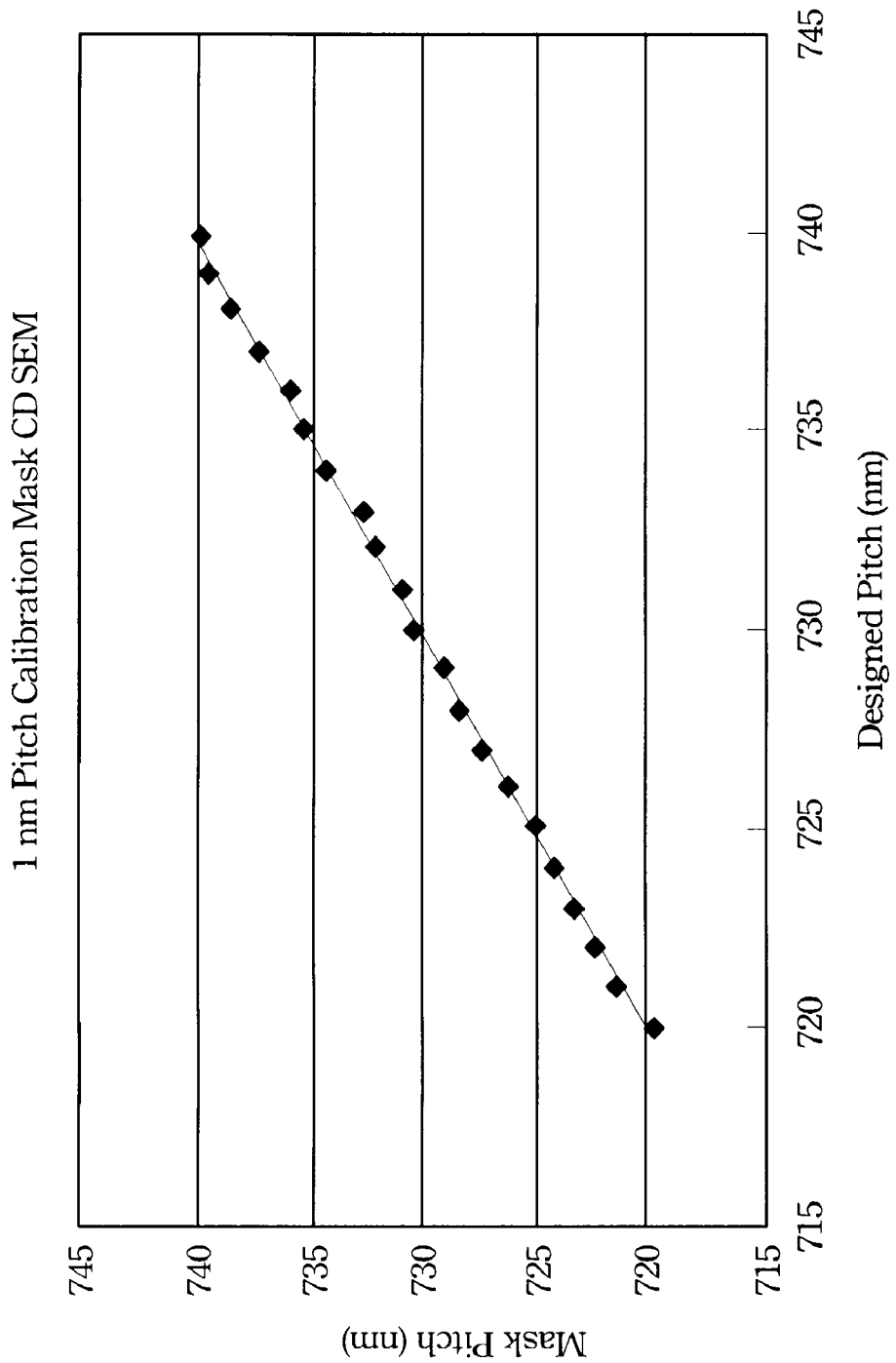
FIGS. 5-12 are graphs illustrating metrological results from exemplary calibration wafers.

Referring now to FIGS. 5-12, graphs showing OCD and SEM measurements for 0.25 nm, 0.50 nm, and 1.00 nm calibrations are shown. In the various graphs, the Y-axis represents measured pitch and the X-axis represents known pitch. In FIG. 5, SEM measurements of a 1.0 nm calibration mask are shown. In this example, the CD correction ($R^2$) for the 1.0 nm calibration mask is about 0.9985. As evident by the CD correction value, the measured mask pitch is very close to the known mask pitch at the 1.0 nm level.

In a further aspect of the invention, conventional demagnification techniques can be used to fabricate a wafer with a sub-nanometer offset. In the example, a demagnification factor of four is used with the 1.0 nm calibration mask to yield a 0.25 nm pitch offset in the wafer. That is, for a pitch of 180.25 and a demagnification factor of four, the mask pitch is 721.00.

Figure 6:
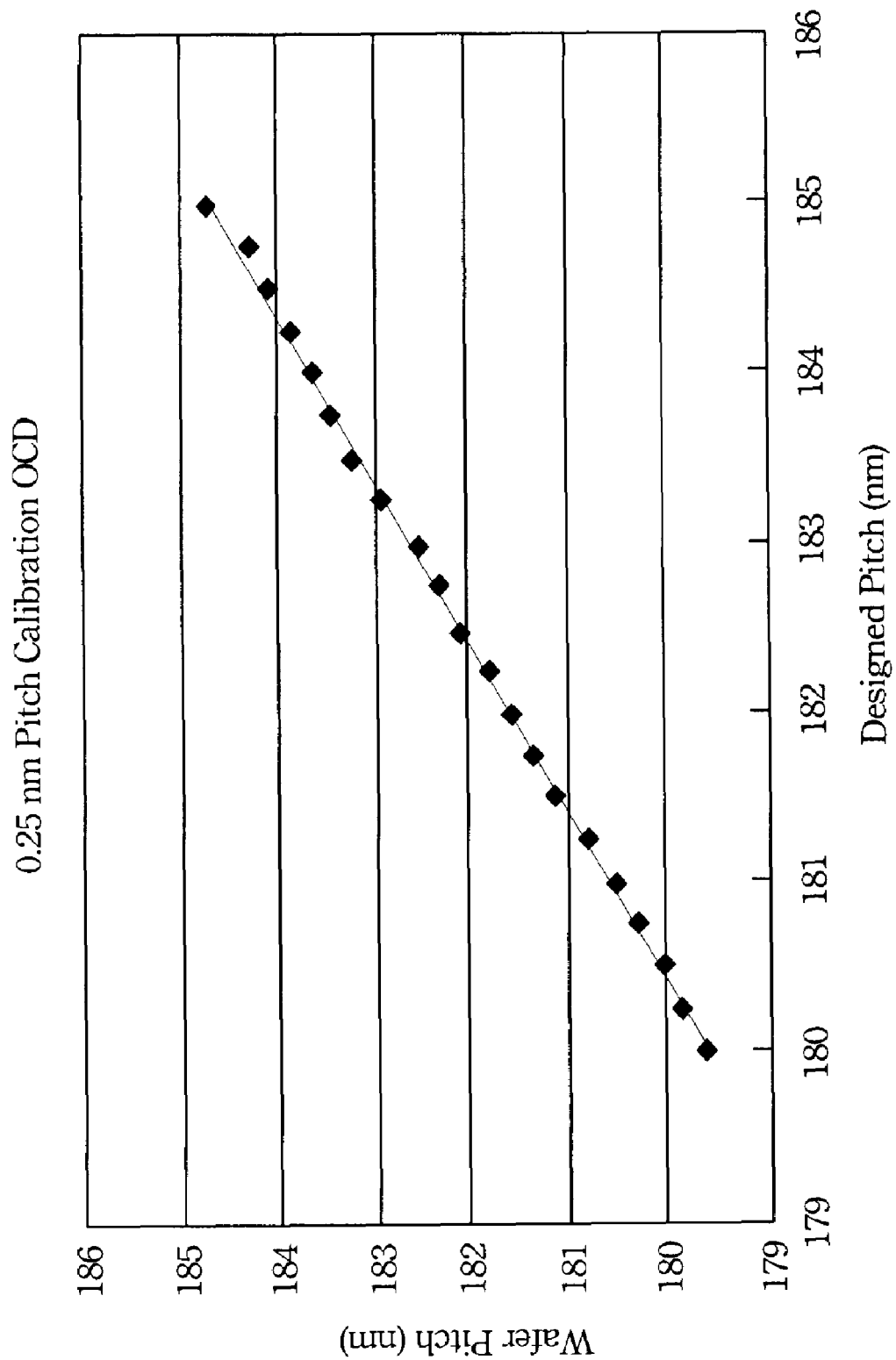
Figure 7:
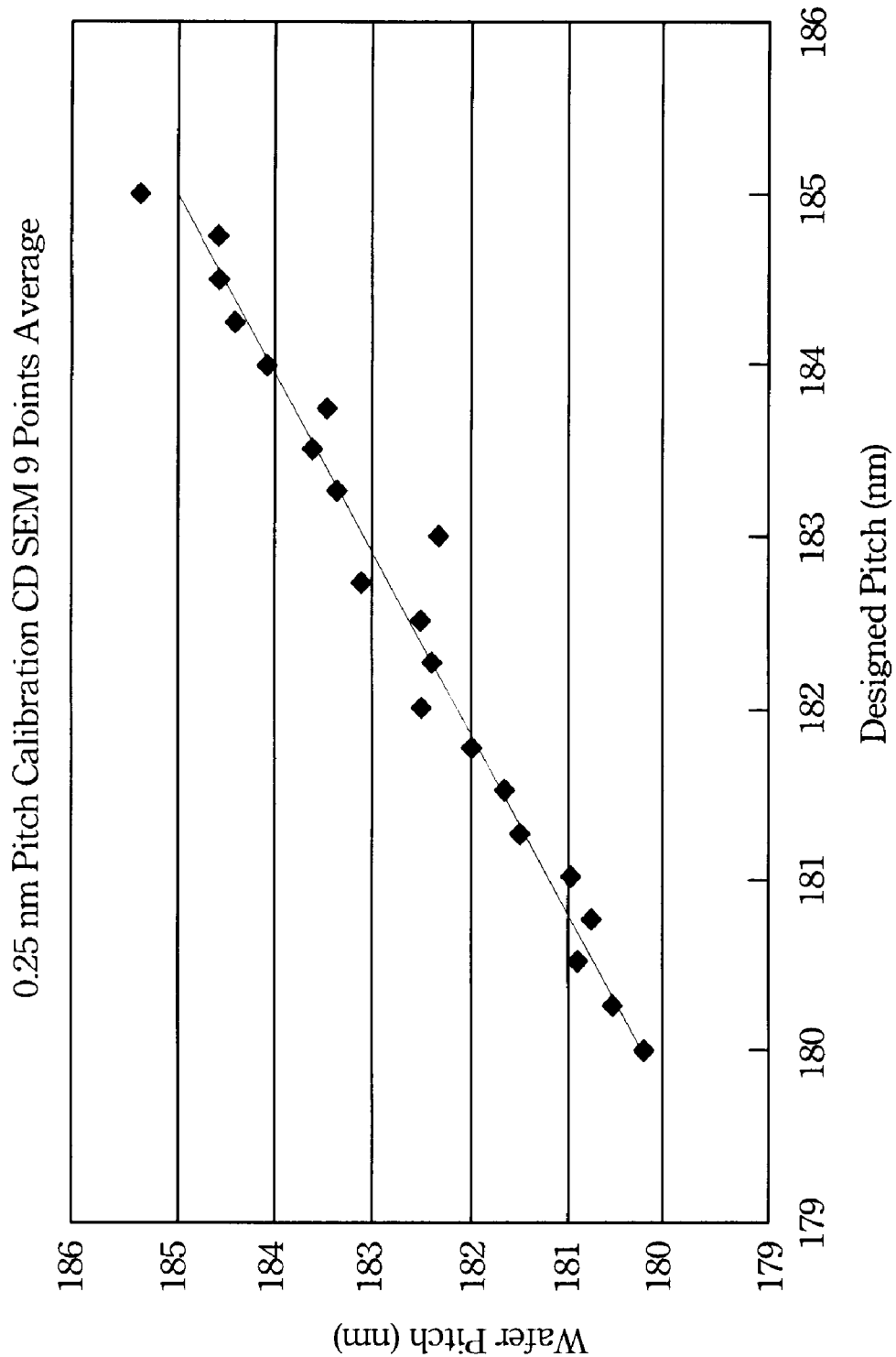
Figure 8:
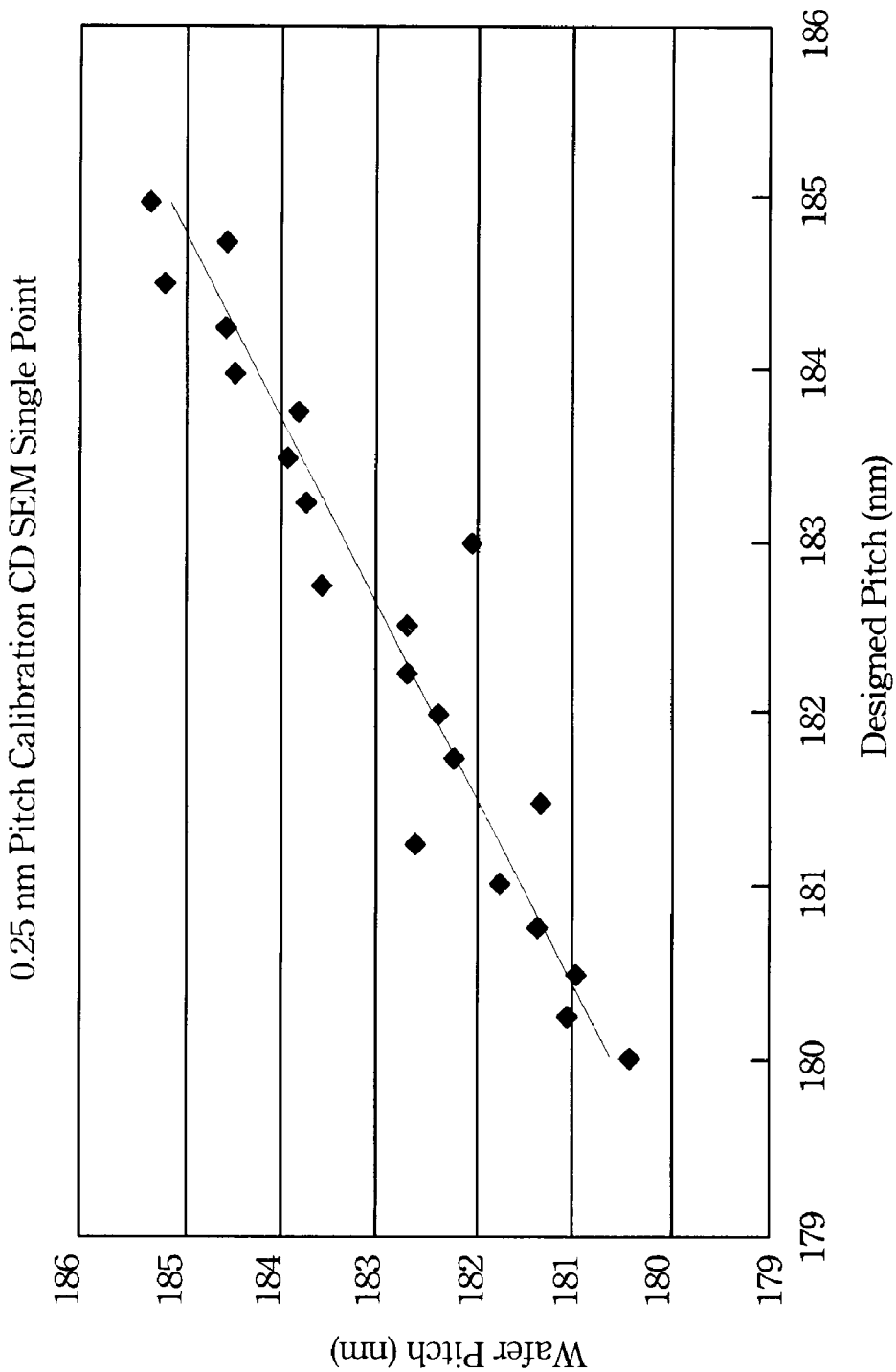

As shown in FIG. 6, the measured wafer pitch is very close to the known wafer pitch of 0.25 as measured using OCD. In this example, the CD correction is 0.9986. On the other hand, as shown in FIG. 6, SEM measurements were found to be less exacting than those with OCD despite the SEM measurements being taken from nine sampling points or zones. In the example of FIG. 7, the CD correction is 0.9729. One skilled in the art will appreciate that for SEM, it is preferred to measure pitch at multiple sampling zones. For example, as shown in FIG. 8, a single point SEM measurement yielded a CD correction of 0.9129 whereas the nine-point SEM measurement yielded a CD correction of 0.9729. Thus, the nine-point average SEM measurements were much more accurate to the OCD measurements than the single-point SEM measurements. It is recognized that the multiple measurements can be determined from multiple sampling zones on a single test wafer or from a single sampling zone on multiple wafers.

Figure 9:
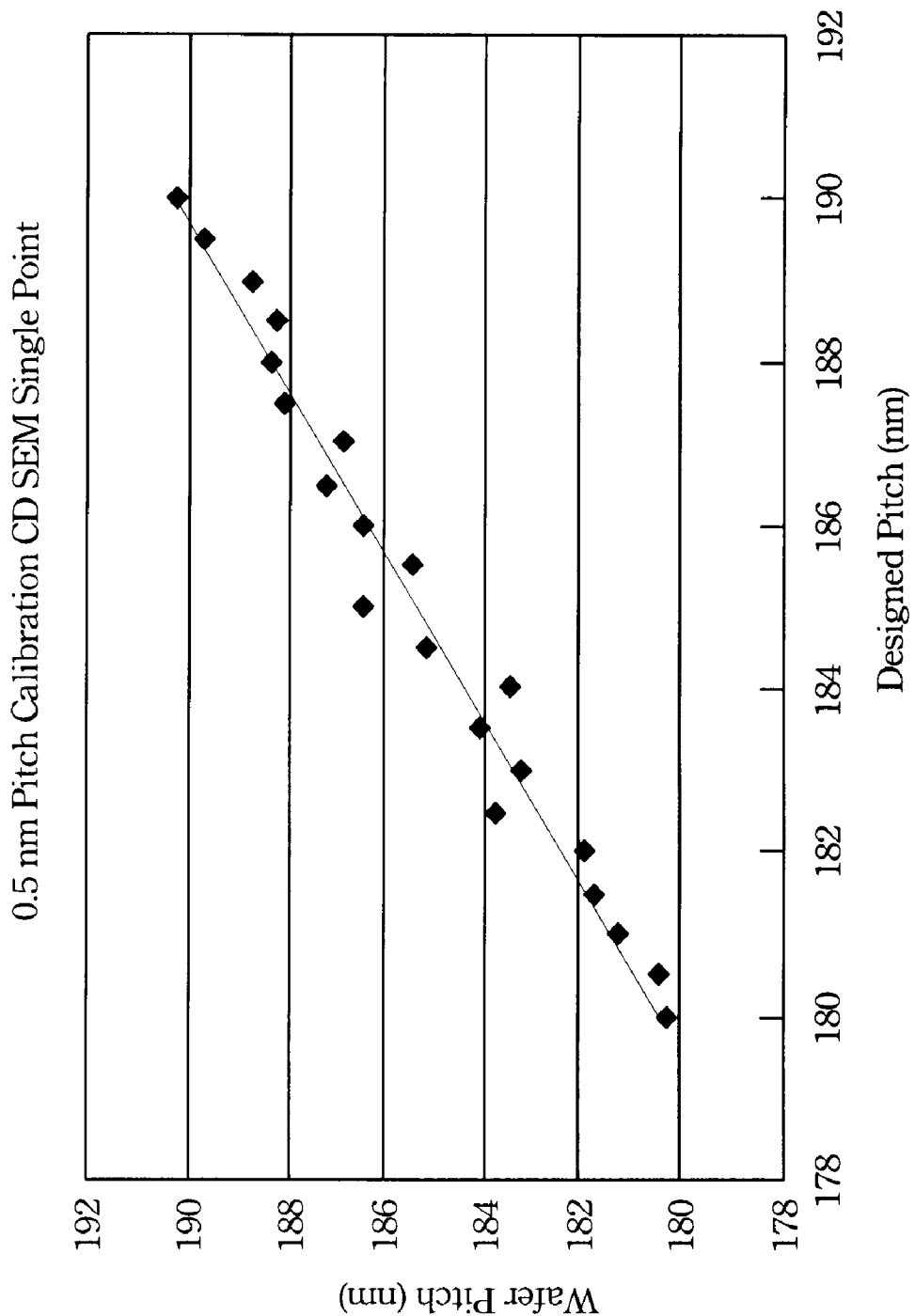
Figure 10:
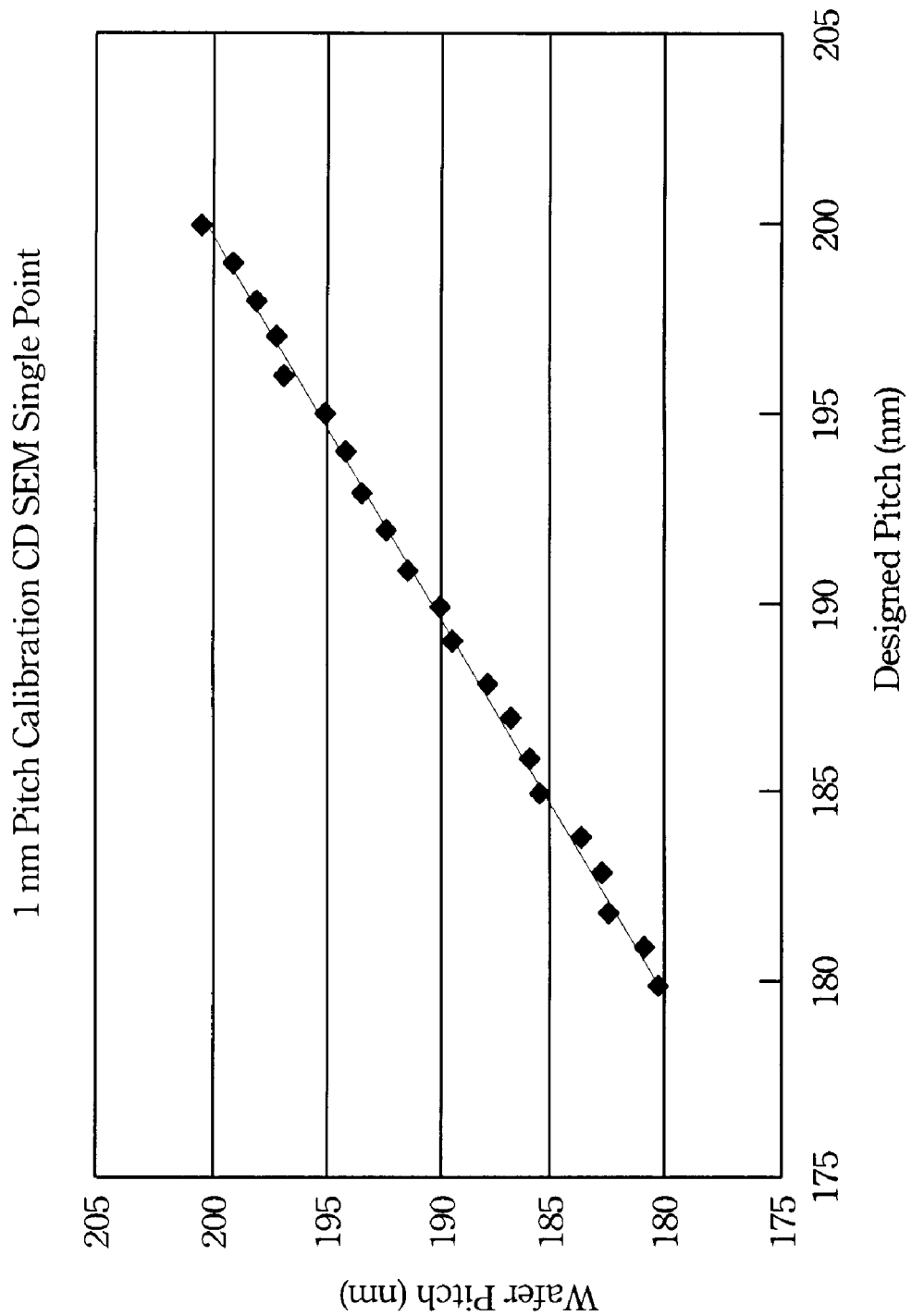

In FIG. 9, the graph illustrates exemplary measurements from single point SEM for 0.5 nm pitch calibration. In this example, the CD correction was found to be 0.9768. However, in the example of FIG. 10, using SEM with averaging of nine samples, the CD correction was found to be 0.996. Thus, in the example, the CD correction error decreases as the number of sampling zones considered for SEM inspection are increased.

Figure 11:
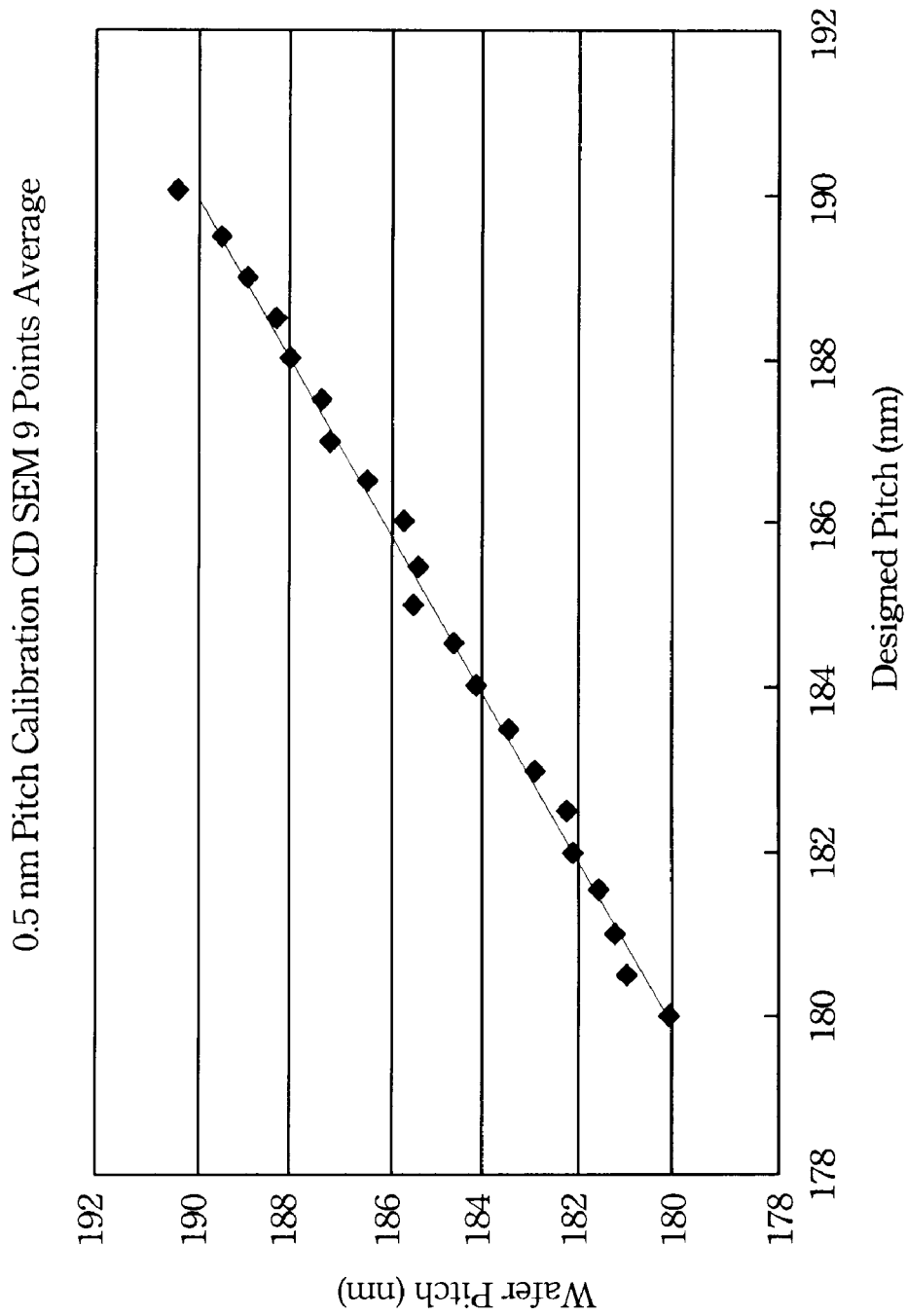
Figure 12:
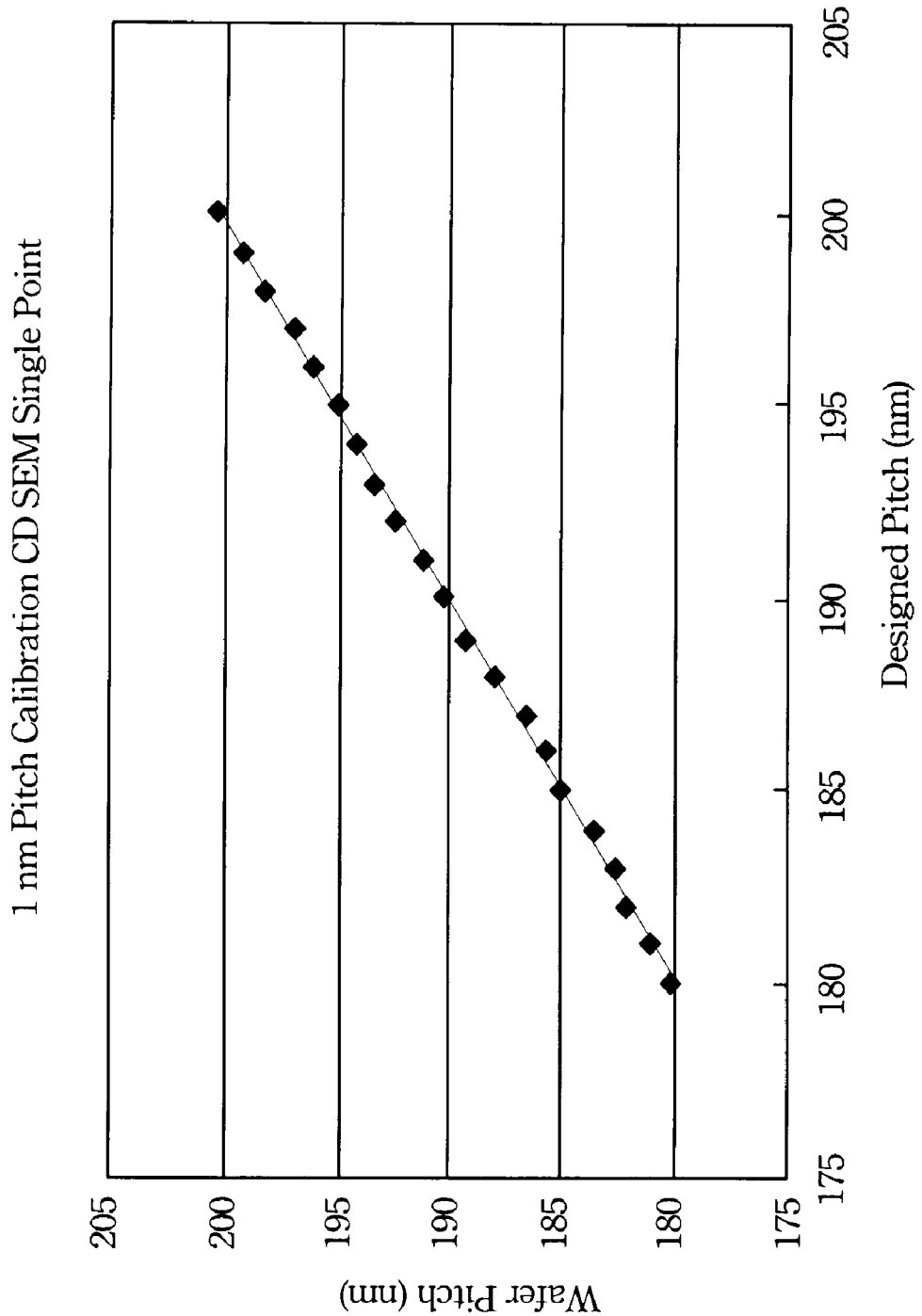

As shown in the example of FIGS. 11-12, at a 1.0 nm calibration, increasing the number of samples (FIG. 12) shows little improvement in CD correction error relative to single-point SEM at 1.0 nm (FIG. 11). In this regard, sampling at only one calibration or sampling zone may be sufficient for 1.0 nm calibrations.

Accordingly, with the present disclosure, the lithography process track described with respect to FIG. 1, or equivalents thereto, is used to fabricate test or calibration wafers having one or more photoresist gratings (CD rulers); the pitch of which can be measured and used to calibrate the measurement tools. By measuring the pitch of photoresist lines in one or more sampling zones formed on the test wafers, performance of metrological tools can be evaluated on the sub-nanometer level. That is, by constructing a first series of calibration lines with a known pitch and constructing a second series of calibration lines with the known pitch plus a sub-nanometer pitch offset, and then measuring the differences in the pitches, appropriate adjustments needed to calibrate the metrological system for sub-nanometer performance can be determined.

Accordingly, in an illustrative embodiment, a first series of calibration lines with a given pitch and a second series of calibration lines with the given pitch plus a pitch offset are formed on one or more test wafers. The pitches are measured, the difference between the measured pitches is determined, and appropriate calibration action is taken to reduce any difference between the measured differential and the known differential.

As such, the invention is effective in assessing what adjustments are needed to calibrate the metrological system. It is recognized that the first series and second series of calibration lines can be formed on the same or different test wafers. In the example of the former, photoresist lines on a single test wafer can be used to provide differential measurements assessing metrological performance. In the example of the latter, those differential measurements can be taken from the photoresist lines on multiple test or calibration wafers. It is further contemplated that more than one differential value may be used to assess metrological system performance. That is, in the example described above, two series of calibration lines are measured and a differential pitch value or offset is determined by subtracting the average pitch value of the first series of calibration lines from the average pitch value of the second series of calibration lines. However, it is also contemplated that three, four, five, etc. sets of calibration lines can be formed to provide a continuum of test patterns that can be measured to assess metrological system performance.

In summary, aspects of the present disclosure provide a mask and technique for measuring sub-nanometer pitch steps. The mask comprises a pattern that includes a magnified pitch or CD offset that, through conventional demagnification techniques, can be transferred to a photoresist to provide sub-nanometer pitch offsets that can be measured for calibrating metrological systems. While the invention has been described to particular sub-nanometer dimensions, the invention is not so limited and it is recognized that the invention can be used to assess metrology performance at other critical dimensions. Moreover, the CD rulers and method of use described herein use pitch rather than line width. As line width is easily affected by process or tool performance, the present disclosure uses pitch, rather than line width, as a performance metric. The CD rulers may be used on test wafers as well as production wafers.

It is to be understood that the foregoing disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method comprising:
providing a first pattern with a first pitch and a second pattern with a second pitch, wherein providing the first pitch and a second patterns includes forming a selected one of the first and second pitches using a mask having a mask pitch that is a multiple of the selected pitch;
determining a difference between the first pitch and the second pitch, the difference being a pitch offset value;
measuring the first pitch of the first pattern;
measuring the second pitch of the second pattern;
determining a difference between the measured first pitch and the measured second pitch, the difference being a measured pitch offset value; and determining metrological accuracy of a metrology system based on proximity of the measured pitch offset value to the pitch offset value.

2. The method of claim 1, wherein the pitch offset value is less than or equal to one nanometer.

3. The method of claim 2, wherein the pitch offset value is 0.25 nanometers.

4. The method of claim 1, wherein the first pitch is measured from a first wafer and the second pitch is measured from a second wafer.

5. The method of claim 1, further comprising patterning a test wafer using the mask with a demagnification factor to provide the selected pitch.

6. The method of claim 5, wherein the demagnification factor is four.

7. The method of claim 1, wherein each of the measuring operations is done with a scanning electron microscope (SEM).

8. The method of claim 1, wherein each of the measuring operations is done with an optical critical dimension (OCD) process.

9. A method for metrological calibration, comprising:
forming a first set of material lines having a first pitch and a second set of material lines having a second pitch;
providing a mask having a mask pitch that is a multiple of the first and second pitches, the mask for forming the first and second sets of material lines measuring the first set of material lines to determine a measured first pitch and the second set of material lines to determine a measured second pitch;
determining a pitch difference between the measured first and second pitches;
comparing the pitch difference to a pre-defined pitch difference; and
determining calibration needed for a metrological tool to reduce any differential between the pitch difference and the pre-defined pitch difference.

10. The method of claim 9, wherein the measuring includes using an OCD process.

11. The method of claim 9, wherein the measuring includes identifying a plurality of calibration zones in a semiconductor wafer and measuring pitch in each of the calibration zones.

12. The method of claim 11, wherein the measuring includes using an SEM process that averages measured pitches in the calibration zones.

13. The method of claim 9, wherein the forming the first and second sets of material lines include masking a semiconductor wafer with demagnification of the mask pitch to mask the semiconductor wafer to have the first and second pitches.

14. The method of claim 9, wherein the pre-defined pitch difference does not exceed one nanometer.

15. The method of claim 9, wherein the forming the first set of material lines and the second set of material lines comprises forming a material layer selected from the group consisting of a dielectric material layer, a conductive material layer, a semiconductor material, and combinations thereof.

* * * * *